(12) United States Patent
Hara et al.

(10) Patent No.: US 7,365,656 B2
(45) Date of Patent: Apr. 29, 2008

(54) DATA IDENTIFICATION METHOD AND APPARATUS

(75) Inventors: Masaaki Hara, Tokyo (JP); Kenji Tanaka, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/646,163

(22) Filed: Dec. 27, 2006

(65) Prior Publication Data
US 2007/0159365 A1    Jul. 12, 2007

(30) Foreign Application Priority Data
Jan. 10, 2006  (JP) .............................. 2006-002980

(51) Int. Cl.
*H03M 7/00* (2006.01)
(52) U.S. Cl. .............................. 341/50; 341/51; 341/58; 341/59; 365/125
(58) Field of Classification Search .................. 341/50
See application file for complete search history.

(56) References Cited

U.S. PATENT DOCUMENTS 6,346,897 B1 * 2/2002 Roh et al. .................. 341/106
6,661,725 B2 * 12/2003 Roh ........................... 365/216
6,895,114 B2 * 5/2005 Hwang ....................... 382/173

OTHER PUBLICATIONS

Brian M. King and Marka Neifeld, Optical Society of America, Sparse Modulation Coding For Increased Capacity In Volume Holographic Storage; Applied Optics, vol. 39, No. 35, pp. 6681-6688, Dec. 10, 2000.

* cited by examiner

*Primary Examiner*—Khai M. Nguyen
(74) *Attorney, Agent, or Firm*—Robert J. Depke; Rockey, Depke & Lyons, LLC.

(57) ABSTRACT

Disclosed herein is a data identification method for identifying, from within a readout signal from a recording medium on or in which user data of k bits are recorded using a recording modulation code wherein m bits from among n bits which compose one codeword have a value of "1" while the remaining n-m bits have another value of "0", the data, n and m being integers including, a first step of delimiting the readout signal in a unit of a codeword and adding, with regard to one of the n-bit codewords obtained by the delimiting, an amplitude of the readout signal of the bits of "1" to $2^k$ different codewords which may possibly be recorded and setting results of the addition as evaluation values, and a second step of finding a maximum value among the $2^k$ evaluation values and outputting the maximum value as an evaluation result.

4 Claims, 17 Drawing Sheets

FIG. 3C

TOTAL BIT NUMBER: 192 BITS × 192BITS

1 SYMBOL: 4 BITS × 4BITS
SUB PAGE: 6 SYMBOLS × 6 SYMBOLS
(AMONG THEM, 4 SYMBOLS REPRESENT SYNC)
1 PAGE: 52 SUB PAGES
(AMONG THEM, 1 SUB PAGE IS PAGE SYNC)

THE EFFECTIVE SYMBOL NUMBER OF 1 PAGE IS
(52-1)*(6*6-4) = 1632 SYMBOLS

WHERE SYMBOLS IN ONE PAGE ARE
REPRESENTED AS symbol (i, j),
i: VERTICAL DIRECTION AND
j: HORIZONTAL DIRECTION, AND
symbol (1, 4:6)
symbol (2, 2:7)
symbol (3:6, 1:8)
symbol (7, 2:7)
symbol (8, 3:6)
INCLUDE USER DATA.

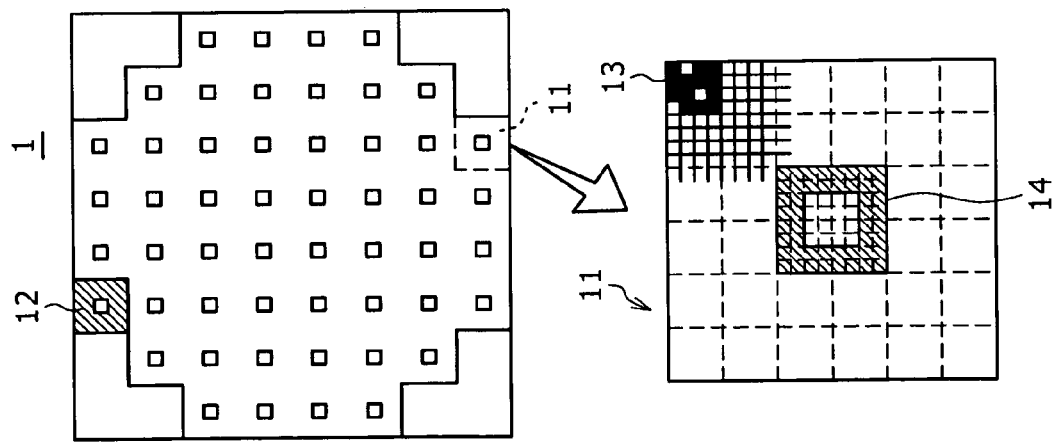

| | | | | | | |
|---|---|---|---|---|---|---|
| ##1#### | ##2#### | ##3#### | ##4#### | ##5#### | ##6#### | ##7#### |
| ##8#### | ##9#### | ##10### | ##11### | ##12### | ##13### | ##14### | ##15### |

(LEGEND)

180## ← DECIMAL NOTATION OF 8 BITS
0 0 1 0
0 0 0 1     ← 4 × 4 SYMBOLS
0 0 0 0
0 0 1 0

FIG. 5

| ## 40 ## | ## 41 ## | ## 42 ## | ## 43 ## | ## 44 ## | ## 45 ## | ## 46 ## | ## 47 ## |
|---|---|---|---|---|---|---|---|
| 1 0 0 0 | 1 0 0 0 | 0 0 0 0 | 0 0 0 0 | 1 0 0 0 | 0 0 0 0 | 1 0 0 0 | 1 0 0 0 |
| 0 0 1 0 | 0 0 1 0 | 0 0 1 0 | 0 1 0 0 | 0 0 1 0 | 0 0 1 0 | 0 1 0 0 | 0 0 1 0 |
| 0 0 0 0 | 1 0 0 0 | 1 0 0 0 | 0 0 0 0 | 0 0 0 0 | 1 0 0 0 | 0 1 0 0 | 0 1 0 0 |
| 1 0 0 0 | 0 0 0 0 | 0 1 0 0 | 0 1 0 0 | 0 1 0 0 | 0 0 0 0 | 0 0 0 0 | 0 0 0 0 |

| ## 48 ## | ## 49 ## | ## 50 ## | ## 51 ## | ## 52 ## | ## 53 ## | ## 54 ## | ## 55 ## |
|---|---|---|---|---|---|---|---|
| 0 1 0 0 | 0 1 0 0 | 0 1 0 0 | 0 0 1 0 | 0 1 0 0 | 0 0 0 0 | 0 0 0 0 | 1 0 0 0 |
| 0 0 1 0 | 0 0 1 0 | 0 1 0 0 | 0 0 1 0 | 0 0 1 0 | 0 0 1 0 | 1 0 0 0 | 1 0 0 0 |
| 0 0 0 0 | 0 0 0 0 | 0 0 0 0 | 0 0 0 0 | 0 1 0 0 | 1 0 0 0 | 1 0 0 0 | 0 0 0 0 |
| 1 0 0 0 | 0 0 0 0 | 0 0 0 0 | 0 1 0 0 | 0 0 0 0 | 1 0 1 0 | 0 0 1 0 | 0 0 1 0 |

| ## 56 ## | ## 57 ## | ## 58 ## | ## 59 ## | ## 60 ## | ## 61 ## | ## 62 ## | ## 63 ## |
|---|---|---|---|---|---|---|---|
| 1 0 0 0 | 0 0 0 0 | 0 1 0 0 | 0 0 1 0 | 1 0 1 0 | 1 0 1 0 | 0 0 1 0 | 0 0 1 0 |
| 0 0 1 0 | 0 0 1 0 | 0 0 1 0 | 1 0 0 0 | 0 0 0 0 | 0 0 0 0 | 1 0 0 0 | 1 0 0 0 |
| 0 0 0 0 | 0 1 0 0 | 0 0 0 0 | 1 0 0 0 | 0 0 0 0 | 1 0 0 0 | 0 0 0 0 | 0 0 0 0 |
| 0 0 1 0 | 0 0 1 0 | 0 0 1 0 | 0 0 0 0 | 1 0 0 0 | 0 0 0 0 | 0 1 0 0 | 0 1 0 0 |

| ## 64 ## | ## 65 ## | ## 66 ## | ## 67 ## | ## 68 ## | ## 69 ## | ## 70 ## | ## 71 ## |
|---|---|---|---|---|---|---|---|
| 1 0 1 0 | 0 0 1 0 | 0 0 1 0 | 0 0 0 0 | 0 0 1 0 | 0 1 0 0 | 1 0 1 0 | 0 0 1 0 |
| 0 0 0 0 | 0 0 0 0 | 1 0 0 0 | 1 0 0 0 | 0 1 0 0 | 0 1 0 0 | 0 0 0 0 | 1 1 0 0 |
| 0 0 0 0 | 0 1 0 0 | 0 1 0 0 | 0 1 0 0 | 0 0 0 0 | 1 0 0 0 | 0 0 0 0 | 0 0 0 0 |
| 0 1 0 0 | 1 0 0 0 | 0 0 0 0 | 0 0 0 0 | 0 0 1 0 | 0 0 0 0 | 0 0 0 0 | 0 1 0 0 |

| ## 72 ## | ## 73 ## | ## 74 ## | ## 75 ## | ## 76 ## | ## 77 ## | ## 78 ## | ## 79 ## |
|---|---|---|---|---|---|---|---|
| 0 0 1 0 | 0 0 0 0 | 0 0 1 0 | 1 0 1 0 | 0 0 1 0 | 0 0 1 0 | 0 0 1 0 | 0 0 1 0 |
| 0 0 0 0 | 0 0 0 0 | 1 0 0 0 | 0 0 0 0 | 0 0 0 0 | 0 0 0 0 | 0 0 0 0 | 0 1 0 0 |
| 0 0 0 0 | 0 1 0 0 | 0 0 0 0 | 0 0 0 0 | 0 1 0 0 | 0 0 0 0 | 0 0 0 0 | 0 0 0 0 |
| 1 0 1 0 | 0 0 1 0 | 0 0 1 0 | 0 0 1 0 | 0 0 1 0 | 0 1 0 0 | 1 0 0 0 | 0 0 0 0 |

(LEGEND)

180 ## ← DECIMAL NOTATION OF 8 BITS
0 0 1 0
0 0 0 1   ← 4 × 4 SYMBOLS
0 0 0 0
0 0 1 0

FIG. 6

| ##80## | ##81## | ##82## | ##83## | ##84## | ##85## | ##86## | ##87## |
|---|---|---|---|---|---|---|---|
| 0 0 1 0 | 1 0 1 0 | 0 0 1 0 | 0 0 1 1 | 1 0 0 0 | 1 0 0 0 | 1 0 0 0 | 0 0 0 0 |
| 0 1 0 0 | 0 0 0 0 | 0 0 0 0 | 0 0 1 0 | 0 1 0 0 | 0 0 0 0 | 0 0 0 0 | 0 0 0 0 |
| 0 0 1 0 | 0 0 1 0 | 0 0 1 0 | 0 0 1 0 | 0 0 0 0 | 0 0 0 0 | 0 1 0 0 | 0 1 0 0 |
| 0 0 0 0 | 0 0 0 0 | 0 1 0 0 | 0 0 0 0 | 1 0 0 1 | 1 0 0 1 | 0 0 0 1 | 0 1 0 1 |

| ##88## | ##89## | ##90## | ##91## | ##92## | ##93## | ##94## | ##95## |
|---|---|---|---|---|---|---|---|
| 0 0 0 0 | 1 0 0 0 | 0 0 0 0 | 1 0 0 0 | 1 0 0 0 | 0 0 0 0 | 0 0 0 0 | 1 0 0 0 |
| 1 0 0 0 | 0 0 0 0 | 0 0 0 0 | 0 1 0 0 | 0 0 0 0 | 0 1 0 0 | 0 1 0 0 | 0 1 0 0 |
| 0 0 0 0 | 0 0 0 0 | 0 1 0 0 | 0 1 0 0 | 0 1 0 0 | 0 0 0 0 | 1 0 0 0 | 0 0 0 0 |
| 0 1 0 1 | 0 1 0 1 | 0 0 0 1 | 0 0 0 1 | 0 0 0 1 | 0 0 0 1 | 0 0 0 1 | 0 0 0 1 |

| ##96## | ##97## | ##98## | ##99## | ##100## | ##101## | ##102## | ##103## |
|---|---|---|---|---|---|---|---|
| 0 0 0 0 | 0 0 0 0 | 0 1 0 0 | 0 1 0 0 | 0 1 0 0 | 0 0 0 0 | 0 0 0 0 | 0 0 0 0 |
| 0 1 0 0 | 0 0 0 0 | 1 0 0 0 | 0 1 0 0 | 0 0 0 0 | 0 0 1 0 | 0 0 0 0 | 0 1 0 0 |
| 0 0 0 0 | 0 0 0 0 | 0 0 0 0 | 0 0 0 0 | 0 0 0 0 | 0 0 1 0 | 1 0 0 1 | 0 1 0 0 |
| 0 1 0 1 | 1 0 0 1 | 0 0 0 1 | 0 0 0 1 | 0 1 0 1 | 0 0 0 1 | 0 0 1 1 | 0 0 0 1 |

| ##104## | ##105## | ##106## | ##107## | ##108## | ##109## | ##110## | ##111## |
|---|---|---|---|---|---|---|---|
| 0 0 0 0 | 0 0 0 0 | 0 0 0 0 | 0 0 0 0 | 0 1 0 0 | 0 1 0 0 | 0 0 0 0 | 0 0 0 0 |
| 1 0 0 0 | 0 0 0 0 | 0 0 0 0 | 0 1 0 0 | 0 0 0 0 | 1 0 0 0 | 1 0 0 0 | 0 1 0 0 |
| 0 0 1 0 | 0 0 1 0 | 0 0 1 0 | 0 0 1 0 | 0 0 0 0 | 0 0 1 0 | 0 0 1 0 | 0 0 0 0 |
| 0 0 0 1 | 0 0 0 1 | 0 1 0 1 | 0 0 0 1 | 0 0 0 1 | 1 0 0 1 | 0 0 0 1 | 1 0 0 1 |

| ##112## | ##113## | ##114## | ##115## | ##116## | ##117## | ##118## | ##119## |
|---|---|---|---|---|---|---|---|
| 1 0 0 0 | 0 0 0 0 | 0 0 0 0 | 0 1 0 0 | 0 0 0 1 | 0 0 0 1 | 1 0 0 1 | 1 0 0 1 |
| 0 0 1 0 | 0 0 1 0 | 0 0 1 0 | 0 0 1 0 | 0 0 0 0 | 0 1 0 0 | 0 1 0 0 | 0 0 0 0 |
| 0 0 0 0 | 0 0 0 0 | 0 1 0 0 | 0 0 0 0 | 0 0 0 0 | 0 0 0 0 | 0 0 0 0 | 1 0 0 0 |
| 0 0 0 1 | 0 1 0 1 | 0 0 0 1 | 0 0 0 1 | 1 0 1 0 | 1 0 0 0 | 0 0 0 0 | 1 0 0 0 |

(LEGEND)
180## ← DECIMAL NOTATION OF 8 BITS
0 0 1 0
0 0 0 1 ← 4 × 4 SYMBOLS
0 0 0 0
0 0 1 0

FIG. 7

| ##120## | ##121## | ##122## | ##123## | ##124## | ##125## | ##126## | ##127## |
|---|---|---|---|---|---|---|---|
| 0 0 1 0 | 0 0 1 0 | 0 0 1 0 | 0 0 1 0 | 0 0 0 0 | 1 0 0 0 | 1 0 0 0 | 0 0 0 0 |
| 0 0 0 0 | 1 0 0 0 | 1 0 0 0 | 0 0 0 0 | 1 0 1 0 | 0 0 0 0 | 0 1 0 0 | 0 1 0 0 |
| 0 0 0 0 | 0 1 0 0 | 0 0 0 0 | 0 0 1 0 | 0 0 0 1 | 0 0 0 0 | 0 0 0 1 | 0 0 1 0 |
| 0 1 0 1 | 0 0 0 1 | 0 0 0 1 | 0 0 1 1 | 0 0 1 0 | 1 0 0 0 | 0 0 0 0 | 0 0 0 0 |

| ##128## | ##129## | ##130## | ##131## | ##132## | ##133## | ##134## | ##135## |
|---|---|---|---|---|---|---|---|
| 0 0 0 0 | 1 0 0 0 | 0 0 0 0 | 0 0 0 0 | 1 0 0 0 | 0 0 0 0 | 0 0 0 0 | 1 0 0 0 |
| 0 1 0 0 | 1 0 0 0 | 1 0 1 0 | 0 0 1 0 | 0 0 0 0 | 0 1 0 0 | 0 1 0 0 | 0 0 1 0 |
| 0 0 0 1 | 0 0 0 0 | 0 0 0 0 | 0 0 0 0 | 0 0 1 0 | 1 0 0 0 | 0 0 0 0 | 0 0 0 0 |
| 0 1 0 0 | 0 1 0 1 | 1 0 0 1 | 0 0 0 0 | 0 0 0 1 | 0 0 1 1 | 0 0 0 0 | 0 0 1 0 |

| ##136## | ##137## | ##138## | ##139## | ##140## | ##141## | ##142## | ##143## |
|---|---|---|---|---|---|---|---|
| 0 0 0 0 | 0 1 0 0 | 0 1 0 0 | 0 1 0 0 | 0 1 0 0 | 0 1 0 0 | 0 0 0 0 | 0 0 0 0 |
| 0 0 1 0 | 0 0 0 0 | 1 0 0 0 | 1 0 0 0 | 0 0 0 0 | 0 1 0 0 | 0 0 0 0 | 0 1 0 0 |
| 0 0 0 1 | 0 0 0 1 | 0 0 0 0 | 0 0 0 0 | 0 0 0 1 | 0 0 0 1 | 0 0 0 0 | 0 0 0 0 |
| 0 1 0 0 | 1 0 0 0 | 0 0 0 0 | 0 1 1 0 | 0 1 0 0 | 0 1 0 1 | 0 0 1 0 | 0 0 0 0 |

| ##144## | ##145## | ##146## | ##147## | ##148## | ##149## | ##150## | ##151## |
|---|---|---|---|---|---|---|---|
| 0 0 0 0 | 1 0 0 0 | 0 0 0 0 | 0 0 0 0 | 0 1 0 0 | 0 0 0 0 | 0 0 0 0 | 0 0 0 0 |
| 1 0 0 0 | 0 0 0 0 | 0 0 0 0 | 0 1 0 0 | 0 0 0 0 | 0 0 1 0 | 1 0 0 1 | 1 0 0 0 |
| 0 0 0 1 | 0 0 0 1 | 0 1 0 1 | 0 0 1 0 | 0 0 0 0 | 1 0 0 0 | 0 0 1 0 | 0 0 1 0 |
| 0 0 1 0 | 0 0 1 0 | 0 1 0 1 | 0 1 1 0 | 0 0 1 1 | 0 0 0 0 | 0 0 0 0 | 0 0 0 0 |

| ##152## | ##153## | ##154## | ##155## | ##156## | ##157## | ##158## | ##159## |
|---|---|---|---|---|---|---|---|
| 1 0 0 0 | 0 0 0 0 | 0 0 0 0 | 0 1 0 0 | 0 1 0 0 | 0 0 0 1 | 0 0 1 0 | 0 0 1 0 |
| 0 0 1 0 | 0 0 1 0 | 0 1 0 0 | 0 0 0 0 | 0 0 0 0 | 1 0 0 0 | 1 0 0 0 | 1 0 0 0 |
| 0 0 0 1 | 1 0 0 1 | 0 1 0 1 | 0 0 1 0 | 0 0 1 0 | 0 1 0 0 | 0 1 0 0 | 0 0 1 0 |
| 0 0 1 0 | 0 1 0 1 | 0 0 1 0 | 0 0 0 1 | 0 0 0 0 | 0 0 0 0 | 0 0 0 0 | 0 0 0 0 |

(LEGEND)

180##  ← DECIMAL NOTATION OF 8 BITS
0 1 0 0
0 0 0 1    ← 4 × 4 SYMBOLS
0 0 0 0
0 0 1 0

FIG. 8

| ##160## | ##161## | ##162## | ##163## | ##164## | ##165## | ##166## | ##167## |
|---|---|---|---|---|---|---|---|
| 1 0 1 0 | 0 0 1 0 | 0 0 1 0 | 0 0 1 0 | 0 0 0 1 | 0 0 0 0 | 1 0 0 0 | 1 0 0 0 |
| 0 0 0 0 | 0 0 0 0 | 0 1 0 0 | 0 1 0 0 | 0 0 0 0 | 1 0 0 1 | 0 0 0 1 | 0 0 0 1 |
| 0 0 0 0 | 0 0 0 1 | 0 0 0 1 | 0 0 0 1 | 0 0 1 0 | 0 0 0 1 | 0 0 1 0 | 0 1 0 1 |
| 0 0 0 1 | 0 1 0 0 | 0 1 0 1 | 0 0 0 0 | 0 1 1 0 | 1 0 0 0 | 0 0 0 0 | 0 0 0 0 |

| ##168## | ##169## | ##170## | ##171## | ##172## | ##173## | ##174## | ##175## |
|---|---|---|---|---|---|---|---|
| 0 0 0 0 | 0 0 0 0 | 0 1 0 0 | 0 0 0 0 | 0 0 0 0 | 0 1 0 0 | 1 0 0 0 | 0 0 0 0 |
| 0 0 0 1 | 1 0 0 0 | 0 0 0 1 | 1 0 0 1 | 0 1 0 0 | 0 0 0 1 | 0 1 0 0 | 1 0 1 0 |
| 1 0 0 0 | 0 0 1 0 | 0 0 0 1 | 1 1 0 0 | 0 1 0 1 | 0 0 0 1 | 0 0 0 1 | 0 0 0 0 |
| 0 1 0 0 | 0 1 0 0 | 1 1 0 0 | 0 0 0 0 | 0 0 0 0 | 0 0 0 0 | 1 0 0 0 | 0 0 0 0 |

| ##176## | ##177## | ##178## | ##179## | ##180## | ##181## | ##182## | ##183## |
|---|---|---|---|---|---|---|---|
| 0 1 0 0 | 0 0 0 0 | 0 1 0 0 | 0 1 0 0 | 0 1 0 0 | 0 1 0 0 | 0 1 0 0 | 0 0 0 0 |
| 0 0 0 0 | 0 1 0 1 | 0 0 0 0 | 1 0 0 0 | 0 0 0 0 | 0 0 0 0 | 0 1 0 0 | 1 0 1 0 |
| 0 0 0 0 | 0 1 0 0 | 0 0 0 1 | 0 0 0 1 | 0 0 0 1 | 0 0 0 1 | 0 0 0 0 | 1 0 1 0 |
| 0 0 0 0 | 0 0 0 0 | 1 0 0 0 | 0 0 0 0 | 0 0 1 0 | 0 1 0 0 | 0 0 0 0 | 1 0 0 0 |

| ##184## | ##185## | ##186## | ##187## | ##188## | ##189## | ##190## | ##191## |
|---|---|---|---|---|---|---|---|
| 0 0 0 0 | 0 0 0 0 | 1 0 0 0 | 0 0 0 0 | 0 0 0 0 | 0 1 0 0 | 0 0 0 0 | 0 0 0 0 |
| 0 0 0 1 | 1 0 0 1 | 0 0 0 1 | 0 0 0 1 | 0 0 1 1 | 0 0 0 1 | 0 0 0 0 | 0 0 0 1 |
| 1 0 0 0 | 0 0 0 1 | 0 0 0 0 | 0 1 0 1 | 0 0 0 1 | 0 0 0 1 | 0 0 0 1 | 0 0 1 1 |
| 0 1 0 0 | 0 0 1 0 | 0 0 1 0 | 0 0 1 0 | 0 0 0 0 | 0 0 1 0 | 0 0 1 0 | 0 0 0 0 |

| ##192## | ##193## | ##194## | ##195## | ##196## | ##197## | ##198## | ##199## |
|---|---|---|---|---|---|---|---|
| 0 0 0 0 | 0 1 0 0 | 0 0 0 0 | 0 0 0 0 | 0 1 0 0 | 0 0 0 1 | 0 0 1 0 | 0 0 1 0 |
| 0 1 0 0 | 0 0 0 1 | 0 0 0 1 | 0 0 0 1 | 0 0 0 1 | 0 0 0 1 | 0 1 0 0 | 0 0 0 1 |
| 0 0 1 0 | 0 0 1 0 | 0 0 1 0 | 0 1 0 1 | 0 0 0 1 | 0 1 0 1 | 0 0 0 1 | 0 0 0 1 |
| 0 0 0 1 | 0 0 0 0 | 0 0 0 0 | 0 0 0 0 | 0 0 0 0 | 0 0 0 0 | 0 0 0 0 | 0 0 0 0 |

(LEGEND)
180## ← DECIMAL NOTATION OF 8 BITS
0 0 1 0
0 0 0 0    ← 4 × 4 SYMBOLS
0 0 0 0
0 0 1 0

FIG. 9

| | | | | | | | |
|---|---|---|---|---|---|---|---|
| ##200## 1 0 1 0<br>1 0 0 0 1<br>0 0 0 0 0<br>0 0 0 0 | ##201## 0 0 1 0<br>0 0 0 0 1<br>0 0 0 0 0<br>0 1 0 0 | ##202## 0 0 1 0<br>0 0 0 0 1<br>0 0 1 0 0<br>0 0 0 0 | ##203## 0 0 1 0<br>0 0 1 0 1<br>0 0 0 0 0<br>0 0 0 0 | ##204## 0 0 1 0<br>0 0 0 0 1<br>0 0 0 0 0<br>0 0 1 0 | ##205## 0 0 1 0<br>0 0 0 1 0<br>0 0 0 1 0<br>0 0 0 0 | ##206## 0 0 0 0<br>0 0 0 0 1<br>1 0 0 0 1<br>1 0 0 1 | ##207## 0 0 0 0<br>0 1 0 0 0 1<br>0 0 0 1<br>|

(Figure 9: table of 4×4 symbols with decimal notation of 8 bits, entries ##200## through ##239##)

(LEGEND) ##180## ← DECIMAL NOTATION OF 8 BITS
0 0 1 0
0 0 0 1
0 0 0 0 0
0 0 0 1 0 ← 4 × 4 SYMBOLS

FIG. 10

| | | | | | | | | |
|---|---|---|---|---|---|---|---|---|
| ##240## 0 1 0 1<br>0 0 0 0 0<br>0 0 0 0 0<br>0 0 1 0 | ##241## 0 0 0 1<br>1 0 0 0 0<br>0 0 1 0 0<br>1 0 0 0 | ##242## 0 0 0 1<br>0 1 0 0 0<br>0 0 1 0 0<br>0 0 0 0 | ##243## 0 1 0 0 1<br>0 0 1 0 0<br>0 0 0 0 0<br>0 0 0 0 | ##244## 0 1 0 0 1<br>0 0 0 1 0<br>0 0 0 0 0<br>0 0 0 0 | ##245## 0 0 0 0 1<br>0 0 1 0 0<br>1 1 0 0<br>0 0 0 0 | ##246## 0 0 0 1<br>0 0 1 0 0<br>0 0 1 0<br>0 0 0 0 | ##247## 0 1 0 1<br>0 0 0 0 0<br>0 0 1 0<br>0 0 0 1 |

(NOT USED indicated by dashed line; ONLY 0 TO 255 ARE USED; 256 TO 275 ARE NOT USED)

(LEGEND)

180## ← DECIMAL NOTATION OF 8 BITS
0 0 1 0
0 0 0 1  ← 4 × 4 SYMBOLS
0 0 0 0
0 0 1 0

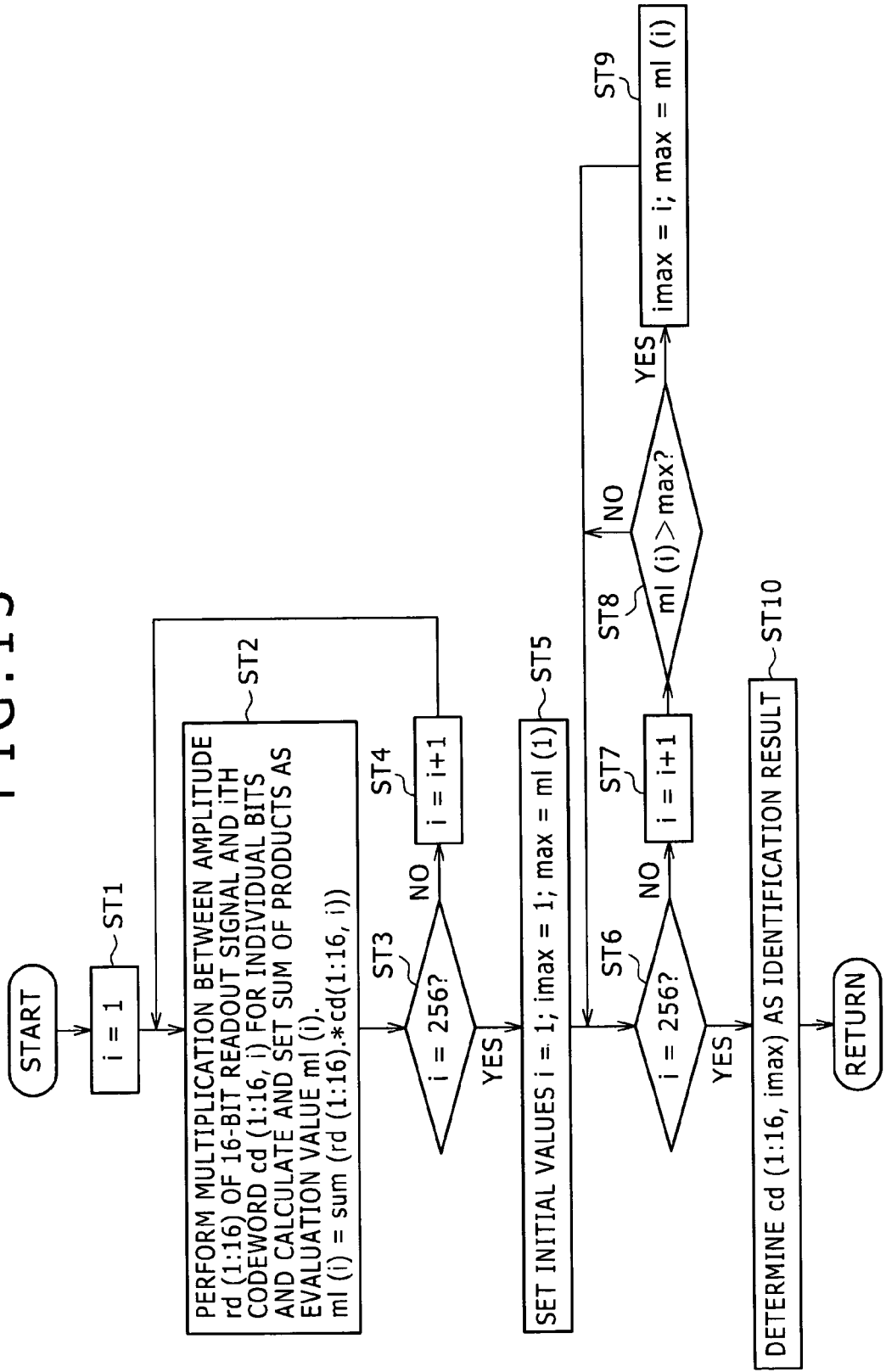

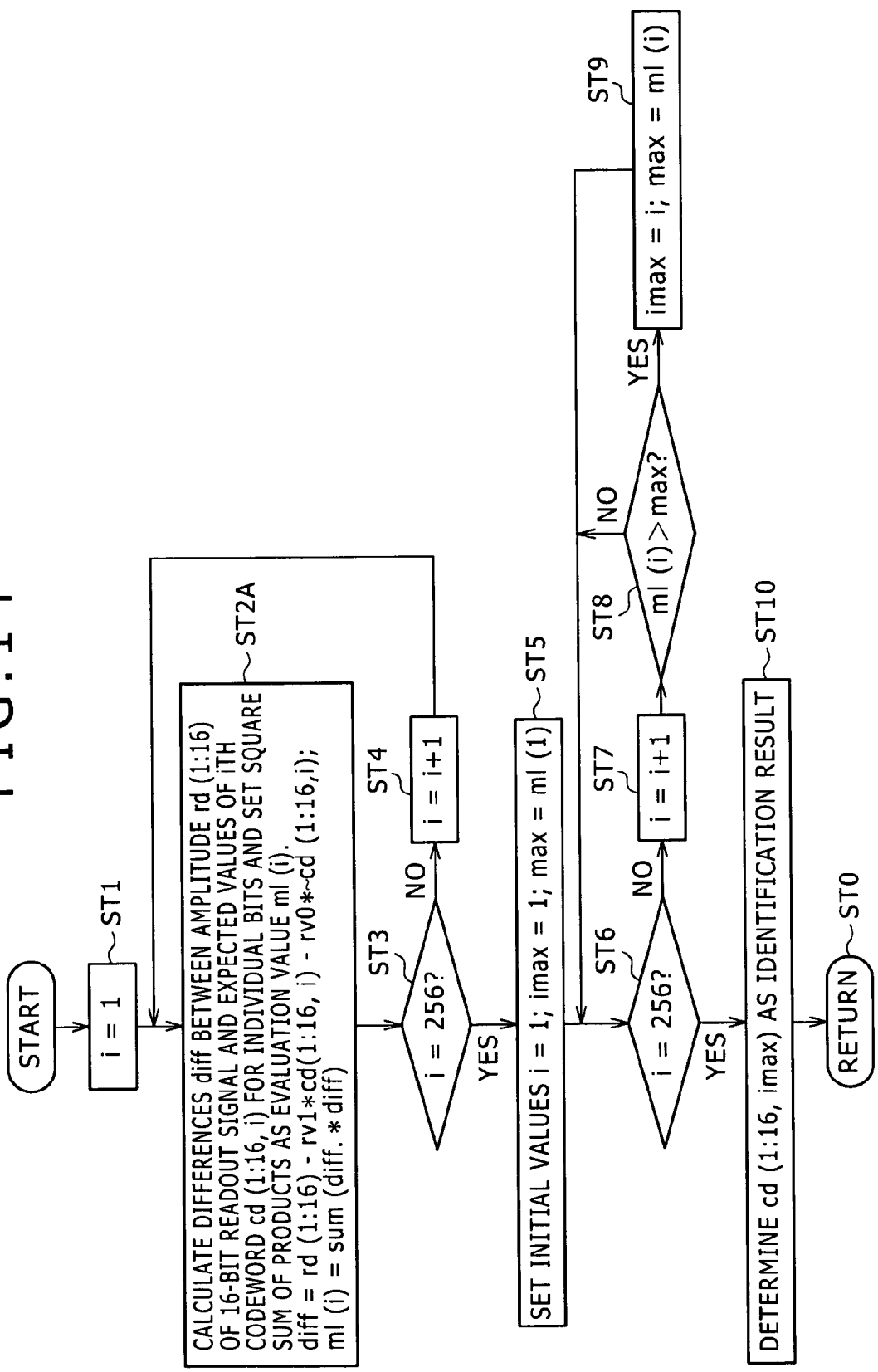

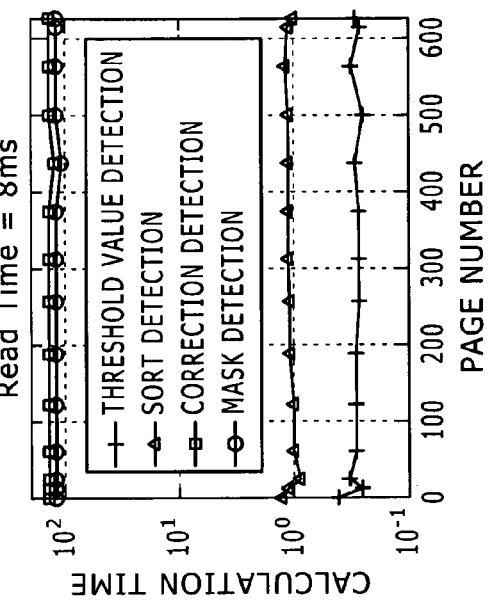
FIG. 16A
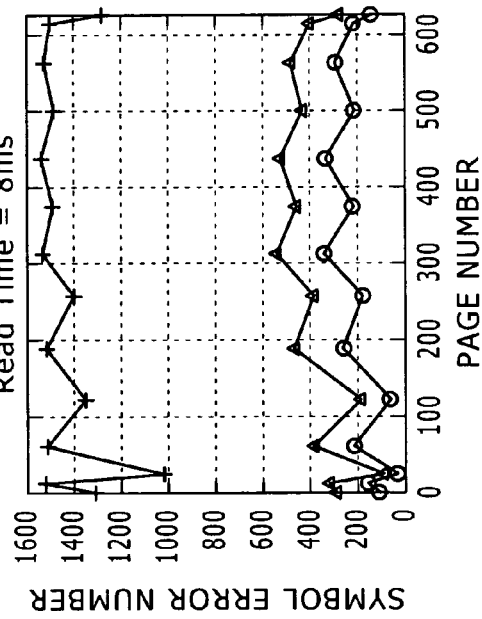
FIG. 16B
| PAGE | 1 | 13 | 25 | 63 | 125 | 188 | 259 | 313 | 375 | 438 | 500 | 563 | 613 | 625 |
|---|---|---|---|---|---|---|---|---|---|---|---|---|---|---|
| THRESHOLD VALUE DETECTION | 1307 | 1522 | 1018 | 1510 | 1349 | 1517 | 1395 | 1531 | 1491 | 1542 | 1491 | 1529 | 1511 | 1284 |
| SORT DETECTION | 290 | 311 | 88 | 374 | 176 | 469 | 379 | 544 | 463 | 534 | 442 | 485 | 398 | 289 |
| CORRECTION DETECTION | 115 | 159 | 31 | 215 | 65 | 270 | 182 | 348 | 221 | 339 | 218 | 294 | 223 | 152 |
| MASK DETECTION | 115 | 159 | 31 | 215 | 65 | 270 | 182 | 348 | 221 | 339 | 218 | 294 | 223 | 152 |
COMPARISON IN SYMBOL ERROR NUMBER
FIG. 16C
| PAGE | 1 | 13 | 25 | 63 | 125 | 188 | 259 | 313 | 375 | 438 | 500 | 563 | 613 | 625 |
|---|---|---|---|---|---|---|---|---|---|---|---|---|---|---|
| THRESHOLD VALUE DETECTION | 0.42188 | 0.26563 | 0.32813 | 0.29688 | 0.29688 | 0.29688 | 0.28125 | 0.28125 | 0.28125 | 0.29688 | 0.25 | 0.32813 | 0.26563 | 0.29688 |
| SORT DETECTION | 1.2656 | 1.1094 | 0.96875 | 1.0625 | 1 | 1.1406 | 1.0938 | 1.1719 | 1.125 | 1.1406 | 1.1563 | 1.1875 | 1.1563 | 1.0625 |
| CORRECTION DETECTION | 136.66 | 139.86 | 139.13 | 139.42 | 139.45 | 139.27 | 140.47 | 139.36 | 138.56 | 127.61 | 139.09 | 139.45 | 139.22 | 138.97 |
| MASK DETECTION | 117.06 | 120 | 119.92 | 119.39 | 119.67 | 119.77 | 119.73 | 119.77 | 119.98 | 110.81 | 119.58 | 120.05 | 119.56 | 120.33 |
COMPARISON IN CALCULATION TIME
FIG. 16D

DATA IDENTIFICATION METHOD AND APPARATUS

CROSS REFERENCES TO RELATED APPLICATIONS

The present invention contains subject matter related to Japanese Patent Application JP 2006-002980 filed in the Japanese Patent Office on Jan. 10, 2006, the entire contents of which being incorporated herein by reference.

BACKGROUND OF THE INVENTION

1. Field of the Invention

This invention relates to a data identification method and apparatus which identifies, from within a readout signal from a recording medium on or in which user data are recorded using a recording modulation code called sparse code, the data.

2. Description of the Related Art

Recently, research and development of an information processing apparatus which makes use of the principle of hologram recording are carried out actively as disclosed, for example, in "Holographic encouraged for implementation of a terabyte disk", *Nikkei Electronics*, Aug. 15, 2005, No. 906, pp. 51-58 (hereinafter referred to as Non-Patent Document 1).

It is already known that, where hologram recording is used, there is the possibility that a much higher recording density than those of existing optical disks may be achieved. It makes a background of the recent active research and development that peripheral techniques have been and are being prepared such as appearance of light sources such as a semiconductor laser and hologram recording media formed using photopolymer.

As a recording modulation code for hologram recording, a recording modulation code called sparse code wherein m bits from among n bits which form one symbol represent "1" while the remaining n-m bits represent "0" is used favorably. The sparse code is disclosed, for example, in B. M. King and M. A. Neifield, "Sparse modulation coding for increased capacity in volume holographic storage", APPLIED OPTICS, Vol. 39, pp. 6681-6688, December, 2000 (hereinafter referred to as Non-Patent Document 2).

In the following, the sparse code is described particularly based on quotations from Non-Patent Document 2.

Where the M number which is an index to the overwriting performance of a hologram recording medium is represented by "M#" and the multiplexing number by which the user can actually perform overwriting is represented by "M", the diffraction efficiency ηpage in a unit of a page is given by the following expression (1):

$$\eta page = (M\#/M)^2 \quad (1)$$

If the ratio of "1s" in a recording modulation code is defined as a sparse rate n1, then in the case of a hologram wherein the number of pixels on one page is "N", the diffraction efficiency ηpixel in a unit of a pixel is represented by the following expression (2):

$$\eta pixel = (M\#/M)^2/(\pi 1 \cdot N) \quad (2)$$

Accordingly, the diffraction efficiency which one pixel can obtain increases as the sparse rate $\pi 1$ of the recording modulation code decreases.

If it is assumed that noise is fixed irrespective of the multiplexing number, then the number M* of pages which can be multiplexed with a fixed diffraction efficiency η* is given by the following expression (3):

$$M^* \propto M\#/\sqrt{\pi 1 \cdot N} \quad (3)$$

Meanwhile, the information entropy. I($\pi 1$) of an ideal encoder whose sparse rate is $\pi 1$ is given, where a sparse rate $\pi 0$ indicative of the ratio of "0s" of the recording modulation code is used, by the following expression (4-1). Further, the user capacity C by the ideal encoder can be calculated using the following expression (4-2):

$$I(\pi 1) = -\pi \cdot \log_2(\pi 1) - \pi 0 \cdot \log_2(\pi 0) \quad (4\text{-}1)$$

[where $\pi 0 = 1 - \pi 1$]

$$C = I(\pi 1) \cdot M^* \quad (4\text{-}2)$$

Although the information entropy is a term difficult to understand, this is equivalent to an encoding rate r=k/n of the recording modulation code where user data of k bits are converted into codewords (symbols) of n bits. The information entropy of the ideal encoder corresponds to the encoding rate where n is infinite.

FIG. 17 illustrates a result of calculation of the user capacity C where the sparse rate $\pi 1$ is varied from 0 to 1.

Since the M number M# may have any particular number, the user capacity is normalized such that it is 1 where the sparse rate $\pi 1$ is $\pi 1 = 0.5$ (the numbers of "1s" and "0s" are equal to each other) with which the information entropy I($\pi 1$) is 1.

From this result, it can be recognized that, in hologram recording, the optimum value of the sparse rate $\pi 1$ is approximately $\pi 1 = 0.25$ and the user capacity exhibits an increase by approximately 15% when compared with an alternative case wherein the sparse rate $\pi 1$ is $\pi 1 = 0.5$ where the numbers of "1s" and "0s" are equal to each other.

In an actual recording modulation code, if the bit number n of a codeword is increased, then encoding and decoding become difficult. Therefore, the bit number n of a codeword assumes a limited value, and the coding efficient becomes lower than that of the ideal encoder. the sparse code which can be implemented can be defined, using the bit number n of one symbol, the number m of bits of "1" in one symbol and the bit number k of the user, by E(n,m,k). Here, the "symbol" is a minimum unit of a holographic reproduction image composed of, for example, 4×4 pixels, and one symbol corresponds to one codeword (sparse code).

Non-Patent Document 2 discloses a working example wherein a page (sparse page) which is a set of sparse codes is coded in E(52,13,39).

The simplest one of data detection methods is "threshold value detection" wherein a readout signal is identified as "1" if the bit amplitude of the readout signal is greater than a threshold value determined in advance but is identified as "0" if the bit amplitude is smaller than the threshold value. On the other hand, in hologram recording in which the sparse code is used, bit detection methods called "sort detection" and "correlation detection" are used favorably.

In hologram recording, since the variation of the bit amplitude in a page is so great that it is difficult to determine a threshold value for threshold value detection, if the threshold value detection is used, then a very great number of errors appear.

The sort detection is carried out in the following procedure.

First, for example, where the sparse code is E(16,3,8), the bit amplitude of 16-bit codewords (one-symbol codes) which form a readout signal is checked and the numbers #1 to #16 are applied to the bits of the codewords in the descending order of the amplitude.

Then, an identification result is determined such that the codeword bits of the numbers #1 to #3 are set to "1" while the remaining codeword bits of the numbers #4 to #16 are set to "0".

If it is assumed that the readout signal is in an AD converted form in 8 bits (0 to 255), then the correlation detection is performed in the following procedure.

Where the readout signal is in an AD-converted form in 8 bits, since it assumes a value within the range from 0 to 255, it is appropriate to set the value 193 which is ¾ of the distribution of such values as a target value rv1 for "1" while the value 64 which is ¼ of the distribution is set as a target value rv0 for "0". Then, for 256 different codewords which may possibly be recorded, at each bit of "1", the square of the amplitude difference between the target value rv1=191 and the readout signal is calculated, but at each bit of "0", the square of the amplitude difference between the target value rv0=64 and the readout signal is calculated. Then, the sum of the square errors for 16 bits is calculated to obtain an evaluation value of the likelihood by which each codeword is recorded.

Then, the evaluation values are compared with each other, and that one of the evaluation values which exhibits the highest likelihood is determined as an identification result.

SUMMARY OF THE INVENTION

When compared with the threshold value detection, the sort detection and the correlation detection have a significant merit that they are not influenced by the amplitude variation.

Although the sort detection can be implemented simply by a circuit because it only involves comparison and sorting of 16 different values, since those 3 bits of a 16-bit signal which have the first to third greatest amplitudes are merely set to "1", there is the possibility that an identification result which is not a codeword may be outputted.

The correlation detection is superior in the identification performance since this is most likelihood detection of selecting the most likely codeword from among those codewords which may possibly be recorded. However, it is necessary to calculate totaling 256 evaluation values through combination of addition and multiplication, and besides the lowest one of the 256 likelihood values is selected. Therefore, the correlation detection has a problem that a very much complicated circuit configuration is necessary for the correlation detection.

Therefore, it is demanded to provide a data identification method and apparatus by which arithmetic operation is simplified while an identification performance similar to that of correlation detection is maintained.

According to an embodiment of the present invention, there is provided a data identification method for identifying, from within a readout signal from a recording medium on or in which user data of k bits are recorded using a recording modulation code wherein m bits from among n bits which compose one codeword have a value of "1" while the remaining n-m bits have another value of "0", the data, n and m being integers, including a first step of delimiting the readout signal in a unit of a codeword and adding, with regard to one of the n-bit codewords obtained by the delimiting, an amplitude of the readout signal of the bits of "1" to $2^k$ different codewords which may possibly be recorded and setting results of the addition as evaluation values, and a second step of finding a maximum value among the $2^k$ evaluation values and outputting the maximum value as an evaluation value.

According to another embodiment of the present invention, there is provided a data identification apparatus for identifying, from within a readout signal from a recording medium on or in which user data of k bits are recorded using a recording modulation code wherein m bits from among n bits which compose one codeword have a value of "1" while the remaining n-m bits have another value of "0", the data, n and m being integers, including an evaluation value production section configured to delimit the readout signal in a unit of a codeword and add, with regard to one of the n-bit codewords obtained by the delimiting, an amplitude of the readout signal of the bits of "1" to $2^k$ different codewords which may possibly be recorded and then set results of the addition as evaluation values, and an identification result outputting section configured to find a maximum value among the $2^k$ evaluation values and output the maximum value as an evaluation result.

In the data identification method and apparatus, a recording modulation code of data recorded on a recording medium is composed of a plurality of codewords, and from among n bits which form one codeword, m bits has the value "1" while the remaining n-m bits have the other value "0".

In the data identification method and apparatus, the readout signal is delimited in a unit of a codeword in conformity with a recording modulation code system upon recording. Then, with regard to one of the n-bit codewords obtained by the delimiting, an amplitude of the readout signal of the bits of "1" is added to $2^k$ different codewords which may possibly be recorded, results of the addition are set as evaluation values.

Then, a maximum value is found from among the $2^k$ evaluation values and outputted as an evaluation result.

The data identification method and apparatus are advantageous in that arithmetic operation can be simplified while an identification performance similar to that of correlation detection is maintained.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIGS. 3A, 3B and 3C are views showing the recorded page of FIG. 2 in a more simplified form; FIGS. 4 to 10 are views illustrating the recorded substance of a table of recording modulation codes;

FIG. 13 is a flow chart illustrating mask detection to which the present invention is applied;

FIG. 14 is a flow chart illustrating a flow of correlation detection as a comparative example;

FIGS. 16A, 16B, 16C and 16D are views illustrating results of simulations and an effect of mask detection.

DETAILED DESCRIPTION OF THE PREFERRED EMBODIMENT

A data identification method to which the present invention is suitable for use with hologram recording and so forth wherein the sparse code is used as a recording modulation code. According to the present embodiment, there is provided a data identification method by which the substance of arithmetic operation is simplified while an identification performance similar to that of correlation detection which achieves the highest identification performance is maintained.

First, the data identification method to which the present invention is applied and which is applied to a hologram recording and reading system is described.

First, a sparse code (recording modulation code) used in the present embodiment is described.

As described hereinabove, an arbitrary sparse code is defined by E(n, m, k) using a bit number n of bits of one symbol, a bit number m of bits having the value "1" in one symbol, and a bit number k of bits of a user. Here, the "symbol" is a minimum unit of a holographic reproduction image, for example, composed of 4×4 pixels, and one symbol corresponds to one codeword (sparse code).

Figure 17:
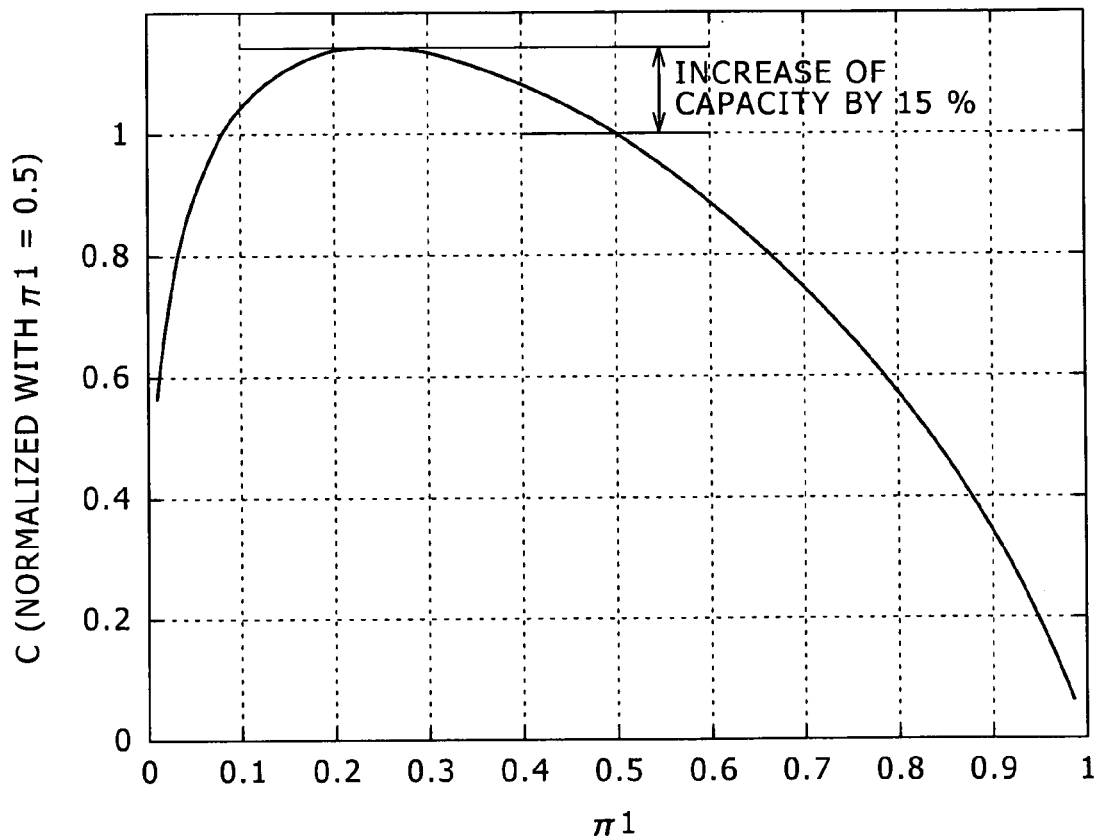
FIG. 17 is a graph illustrating a result of calculation of the user capacity C when the sparse ratio is varied from 0 to 1.

As described hereinabove, the recording capacity (user capacity) C of an ideal encoder which can be utilized by the user correlates with a sparse rate n corresponding to the encoding rate of n bits and has a maximum value in the proximity of the sparse rate $\pi 1 = 0.25$ (refer to FIG. 17).

Figure 1:
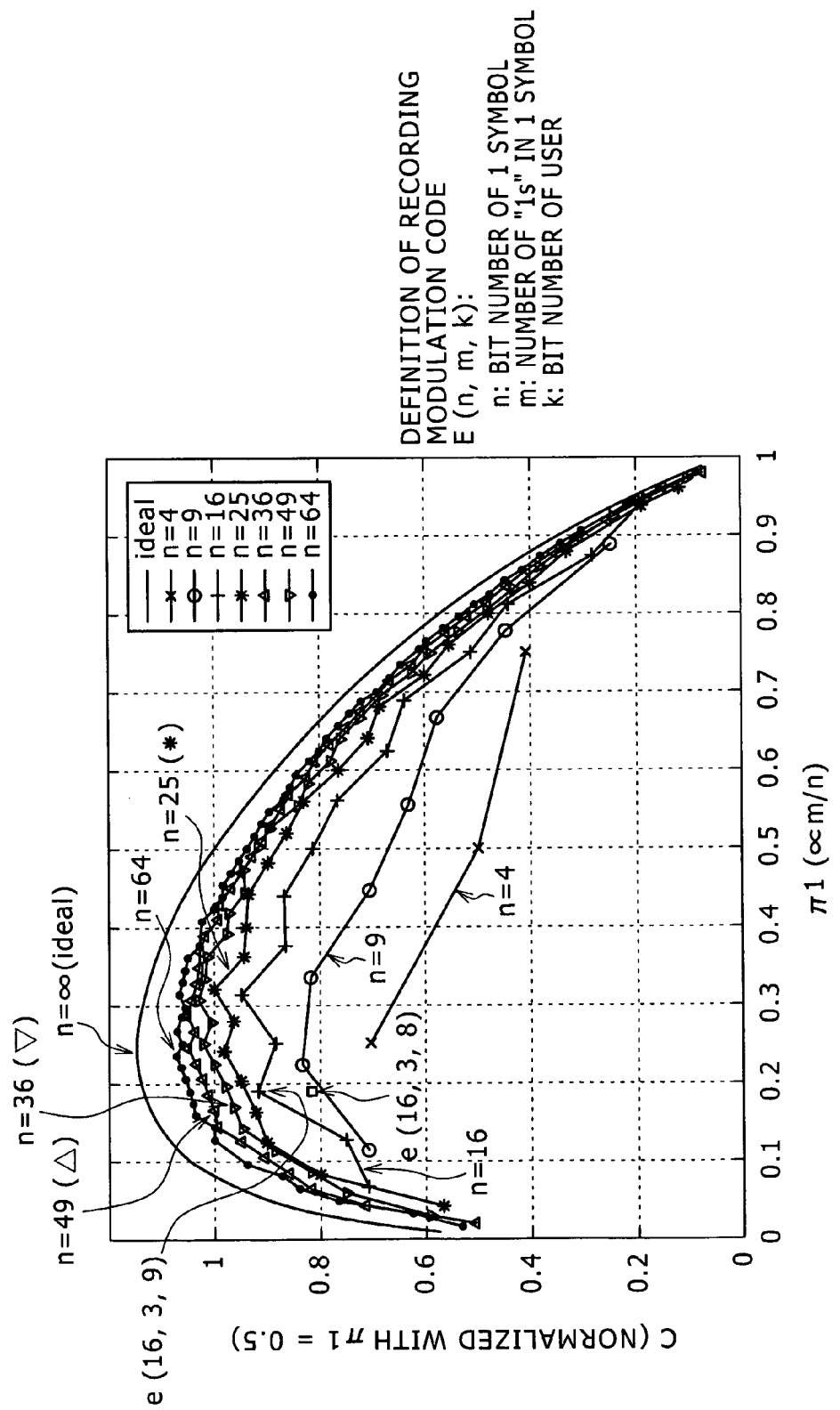
FIG. 1 is a graph illustrating a relationship between the sparse rate and the user capacity C when the bit number n of the sparse code varies from 4 to 64.

FIG. 1 illustrates the relationship between the sparse rate $\pi 1$ and the recording capacity C when the bit number n of the sparse code is varied within a range from 4 to 64.

It can be seen from FIG. 1 that, as the bit number n of the sparse code increases, the encoding rate r=k/n increases and an ideal encoder (n=∞) is approached. The encoding rate r is determined from a relationship between a combination $_nC_m$ where m elements are selected from among n elements and $2^k$, and a maximum integer k which satisfies the condition of $2^k < _nC_m$ becomes a bit number of the user. For example, where n=16 and m=3, if the case wherein k=9 and the case wherein k=8 are compared with each other, then since $2^9 > 2^8$ although the combination $_nC_m$ (which increases in proportion to the axis of abscissa of FIG. 1) is equal, it can be seen from FIG. 1 that the user capacity C of E(16, 3, 9) is greater than the user capacity of E(16, 3, 8).

Figure 2:
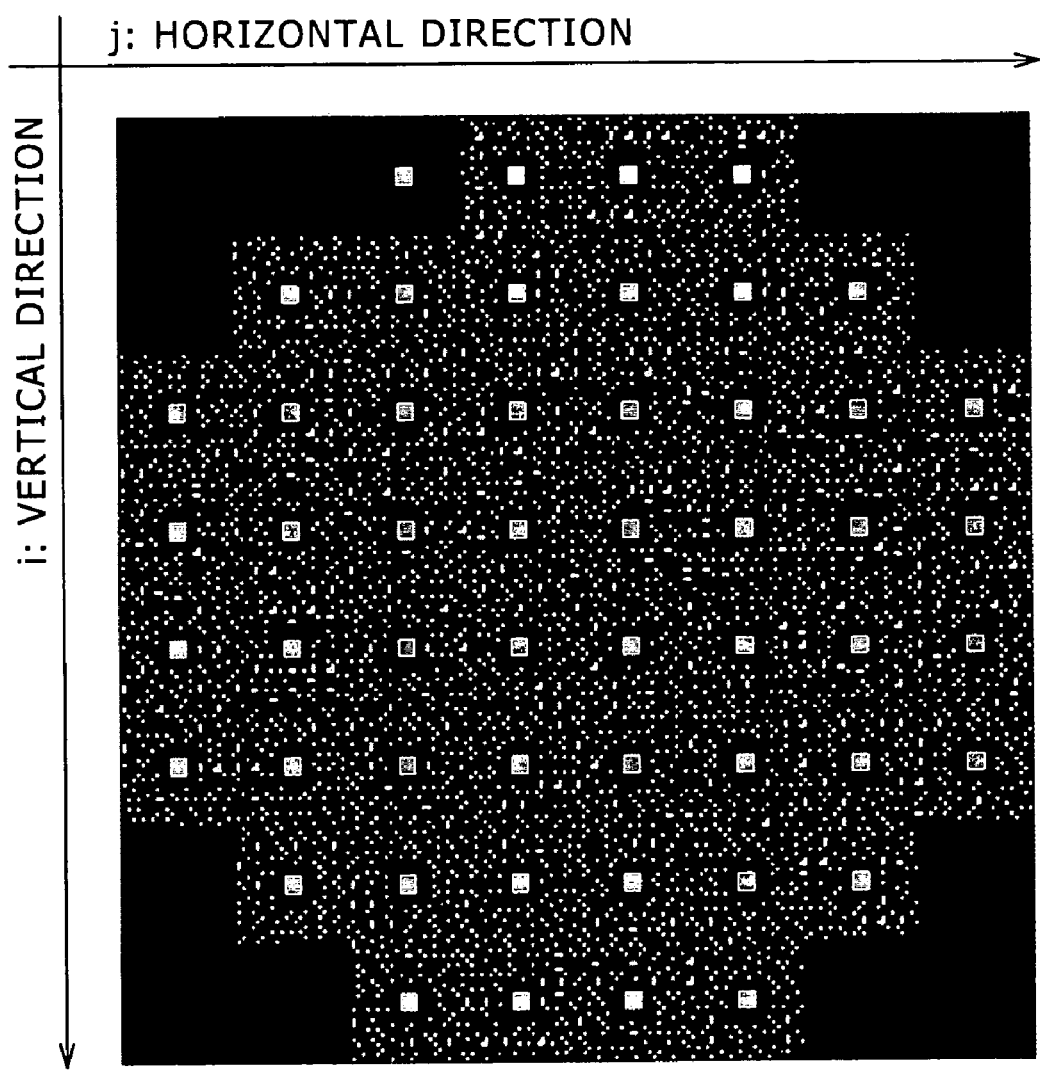
FIG. 2 is a view showing an example of a recorded page by actual hologram recording.

FIG. 2 shows an example of a recorded page actually recorded by hologram recording. FIGS. 3A and 3B show the recorded page of FIG. 2 in a simplified form and FIG. 3C illustrates explanation of the recorded page.

As seen from FIGS. 3A and 3C, the recorded page 1 includes 51 sub pages 11 for data recording and one sub page (page sync.) 12 for synchronization.

Each of the sub pages 11 includes 6×6 symbols 13 as seen in FIG. 3B. A sync (sync.) 14 is formed from four central symbols from among the 36 symbols 13. The sync 14 includes a central region of white corresponding to one symbol and a surrounding region of black.

Each symbol has a configuration of 4×4 bits wherein a "1" data bit represents white and a "0" data bit represents black.

Accordingly, as seen in FIG. 3C, from among the total bit number of 36,864 (=192×192), the number of effective symbols of the recorded page 1 is 1,632 bits.

Here, E(16, 3, 8) is used as the sparse code. If three bits from among 16 bits are set to "1", then the number of combinations where three bits are selected from among 16 bits is $_{16}C_3 = 560$. Therefore, from $2^9 = 512 < 560$, it is possible to set the user bit number to 9 to produce E(16, 3, 9). However, in the present embodiment, only $2^8$ 256 symbols are used intentionally. This arises from the following reasons.

First, if a detection method which utilizes the presence of an unused symbol effectively is used, then the number of detection errors can be reduced.

Second, it is desired to restrict the number of "1s" which appear successively in vertical and horizontal directions to minimize low-frequency components of recorded data. In particular, as hereinafter described above, "1" is not disposed successively in any of the vertical and horizontal directions within a symbol of the sparse code. Further, although two "1s" appear successively between different symbols, three or more "1s" do not appear successively. Although partitioning between different symbols can be performed with a high degree of accuracy with the sync 14, also in this instance, it is desired to minimize the number of locations at which two "1" bits appear successively.

FIGS. 4 to 10 illustrate the recorded substance of a table for recording modulation codes.

In the table of FIGS. 4 to 10, 256 different symbols adopted by the sparse code E(16, 3, 8) are collected. The symbols have been determined through a search for those symbols which satisfy the conditions that only 3 bits from among 16 bits have the value "1" and besides that "1" does not appear successively in any of the vertical and horizontal direction within each symbol. Although actually 276 different symbols which satisfy the conditions described have been found, 256 ones from among the 276 symbols are selectively used each of which indicates a comparatively low value where it is converted into a 16-bit binary number such that the left upper bit is determined as the least significant bit LSB while the right lower bit is determined as the most significant bit MSB.

Figure 11:
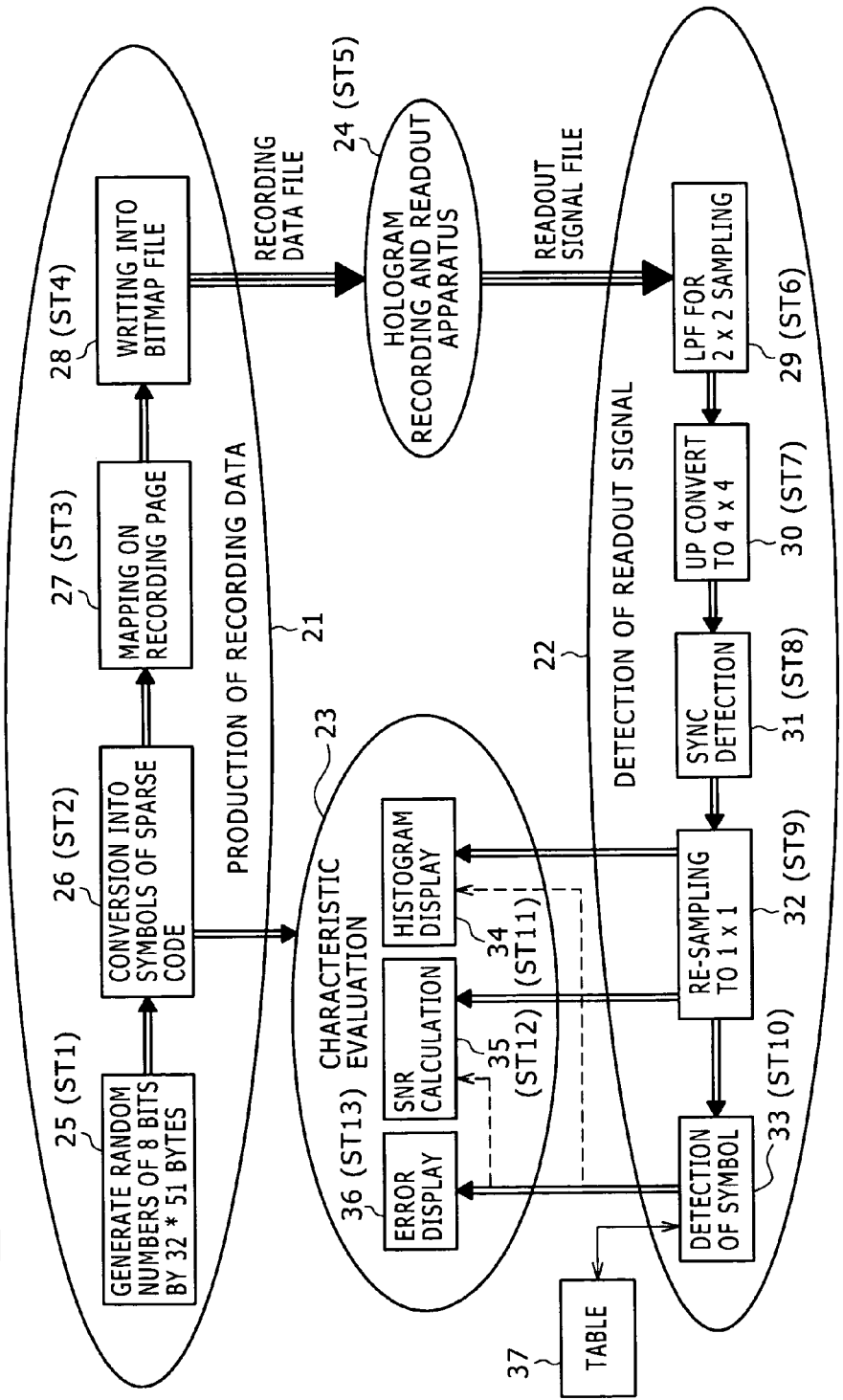
FIG. 11 is a block diagram showing a system configuration of a hologram recording and reproduction apparatus to which the present invention is applied.

FIG. 11 shows a system configuration of a hologram recording and reproduction apparatus. It is to be noted that FIG. 11 illustrates also a processing flow, and a processing procedure is indicated by arrow marks. The substance of a process is illustrated in each elongated circle.

Referring to FIG. 11, the hologram recording and reproduction apparatus 20 shown includes a recording data production block 21, a readout signal detection block (recorded data reproduction) 22, a characteristic evaluation block 23 and a hologram recording and readout apparatus 24. The blocks mentioned may be formed as individual apparatus separate from each other, or, for example, the blocks other than the hologram recording and readout apparatus 24 may be formed from a single processing apparatus.

The recording data production block 21 includes a random number generation section 25 (random number generation step ST1), a code conversion section 26 (code conversion step ST2), a mapping section 27 (mapping step ST3) and a file writing section 28 (file writing step ST4).

Though not shown, the hologram recording and readout apparatus 24 includes various sections including a DMD (Digital Micromirror Device) as a recording SLM (Spatial Light Modulator), a CMOS sensor as an image pickup device for detecting readout light, and a hologram recording medium. The hologram recording and readout apparatus 24 further includes a light source for signal light (physical light) modulated by the DMD and an illuminating light source for the signal light, and optical systems for reference light and illumination light which are irradiated together with a signal on the hologram recording medium upon recording. The hologram recording and readout apparatus 24 further includes a readout optical system for forming, upon reading out, an image of readout light on an image pickup plane of the CMOS sensor, a data conversion section, and a control section for the components mentioned of the hologram recording and readout apparatus 24. The hologram recording and readout apparatus 24 uses the components such that light from the light source is optically modulated by the predetermined DMD with a signal of a recorded data file from the file writing section 28 (file writing step ST4) and irradiates the modulated light on the recording medium together with the reference light to record a hologram on the recording medium. Then, reference light of the same conditions as those upon recording is irradiated upon the recording medium to read out the recorded data and outputted as a readout signal (file).

The step at which the series of processes described is executed is referred to as hologram recording and readout processing step ST5.

The readout signal detection block 22 includes a low-pass filter (LPF) section 29 (LPF processing step ST6), an up converter 30 (up conversion step ST7), a sync detection section 31 (sync detection step ST8), a re-sampling section 32 (re-sampling step ST9) and a symbol detection section 33 (symbol detection step ST10).

The symbol detection section 33 (symbol detection step ST10) principally executes the data identification method to which the present invention is applied. It is to be noted that a control section (CPU or the like) for the entire hologram recording and reproduction apparatus may execute part of the data identification method to which the present invention is applied.

The characteristic evaluation block 23 includes a histogram display section 34 (histogram display step ST11) which produces a histogram for data display from a signal from the re-sampling section 32 (re-sampling step ST9) or a signal after symbol detection. The characteristic evaluation block 23 further includes an SNR calculation section 35 (SNR calculation step ST12) which calculates a signal to noise ratio (SNR) from a signal from the re-sampling section 32 (re-sampling step ST9) or a signal after symbol detection, and an error display section 36 (error display step ST13) which performs error display.

Now, operation of the hologram recording and reproduction apparatus 20 having the configuration described above is described.

The recording data production block 21 generates 8-bit random numbers by 32×51=1,632 bytes (13,056 bits) equal to the user data number k for one page. In the present example, since one symbol represents data of 8 bits (1 byte) and the number of effective symbols in one page is 1,632 as seen from FIGS. 3 and 4 to 10, a number of random numbers equal to the number of symbols are generated.

The 8-bit data generated as random numbers are sent to the code conversion section 26 (code conversion step ST2), by which they are converted into symbols of the sparse code wherein only 3 bits from among 16 bits are "1" and the remaining bits are "0". It is to be noted that, where recording data are to be produced from content data of predetermined sound, image, document or the like, the random number generation section 25 (random number generation step ST1) is omitted, and an amount of sparse codes corresponding to the magnitude of the content data is produced by the code conversion section 26 (code conversion step ST2).

Then, the mapping section 27 (mapping step ST3) combines the symbols of the sparse code and the sync 14 and page sync 12 (refer to FIG. 3) to produce recording pages.

Finally, the file writing section 28 (file writing step ST4) converts the recording pages into data of a file format, for example, into a bitmap file which can be read by an experimental apparatus for hologram recording.

The bitmap file produced by the recording data production block 21 is sent to the hologram recording and readout apparatus 24, by which hologram recording and reading out are executed.

First, an image wherein each pixel of the DMD (Digital Micromirror Device) used as an SLM (Spatial Light Modulator) for recording is set to on or off in response to the data of "1" or "0" of the bitmap is irradiated on the hologram recording medium. At this time, multiplexed-recording may be performed in accordance with conditions of the light reference position of the medium and reference light at this time.

Upon reading out, reference light is irradiated upon the hologram recording medium at the position and in the conditions same as those upon recording. At this time, light (readout light) from the medium is focused on the image plane of the CMOS sensor by a predetermined optical system. Further, the position of the CMOS sensor is adjusted as precisely as possible to perform reading out. The magnification of the CMOS sensor (or readout light) is adjusted together with the position of the CMOS sensor (or readout light) so that light from one pixel of the DMD may be irradiated upon the light receiving section of the 2×2=4 CMOS sensors. It is to be noted that, while various methods are available for hologram recording and readout, any method may be used here.

An image signal is outputted from the CMOS sensor and is converted into and outputted as a readout signal file to the readout signal detection block 22.

In the readout signal detection block 22, the low-pass filter (LPF) section 29 (LPF processing step ST6) first passes the readout signal after oversampled to 2×2 through a simple two-dimensional LPF to limit the bandwidth. Although any method may be used for the oversampling, a method of merely averaging sensor outputs of four sensors is used.

Then, in order to raise the accuracy of re-sampling, the up converter 30 (up conversion step ST7) up converts to 4×4.

Then, the sync detection section 31 (sync detection step ST8) detects the page sync and sub page sync in order. In particular, the sync detection section 31 detects the page sync 12 illustrated in FIG. 3A thereby to detect the top of a page. Thereafter, every time a signal part which corresponds to a white square (sync 14) of 4×4 bits which appears periodically is detected, the sync detection section 31 delimits the sub pages 11 converted with reference to the sync 14 and then symbols 13 of 4×4 bits which form the sub pages 11. Thereafter, the next re-sampling section 32 (re-sampling step ST9) and the symbol detection section 33 (symbol detection step ST10) are executed in synchronism so that the delimiting may not be displaced.

The re-sampling section 32 (re-sampling step ST9) performs re-sampling so that each data may correspond in a one-by-one (1×1) corresponding relationship with a pixel of the SLM (DMD) in the hologram recording and readout apparatus 24 to decompose the data in a unit of a symbol 13. Then, the next symbol detection section 33 (symbol detection step ST10) executes, for example, "detection wherein those 3 bits which exhibit a comparatively great amplitude from among 16 bits are set to "1" and the sum of the 3 bits is set as an evaluation value", that is, detection which uses the data identification method to which the present invention is applied. Details of the data detection are hereinafter described.

A table 37 for use for data detection is provided in the symbol detection section 33. The table 37 stores the combinations of the determined sparse codes of FIGS. 4 to 10. Further, the code conversion section 26 (code conversion step ST2) may re-write the table 37 in response to a result of the conversion of the sparse code of the code conversion section 26 (code conversion step ST2).

The recorded data (detection signal data) restored by the data detection are sent to the characteristic evaluation block 23, by which a predetermined evaluation process is performed for the recorded data.

Although any evaluation process may be used, histogram display, SNR calculation and error display are described as examples.

The error display section 36 (error display step ST13) maps bits and symbols 13 (FIG. 3) at which an error is detected on the page and displays the positions at which the error is detected.

Further, the SNR calculation section 35 (SNR calculation step ST12) calculates an average value and a variance of "1s" and "0s" over the overall page to determine a signal to noise ratio (SNR). Further, the SNR calculation section 35 (SNR calculation step ST12) calculate an amplitude distribution of "1" data and an amplitude distribution of "0" data and displays a histogram.

Figure 12B:
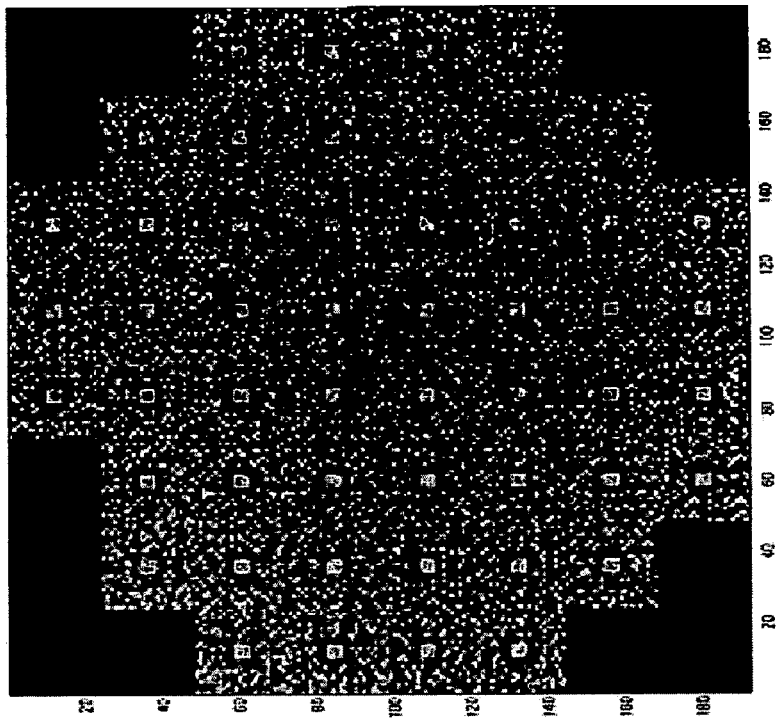
FIGS. 12A and 12B are map diagrams of a readout signal from a recorded hologram.
Figure 12A:
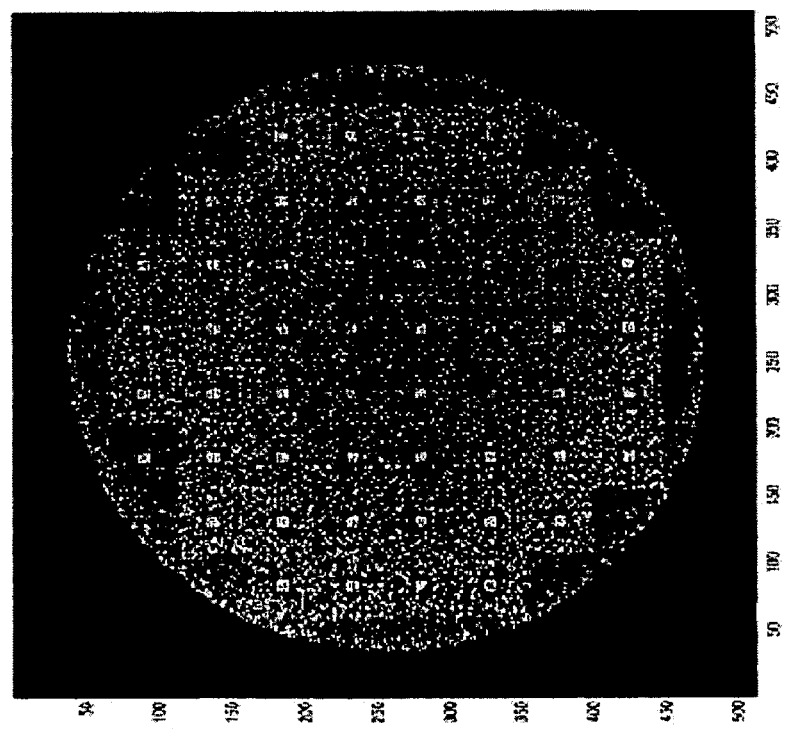

FIGS. 12A and 12B illustrate an example of a readout signal of recorded holograms.

FIG. 12A shows a bitmap of a readout signal where 2×2=4 sensor light receiving sections are allocated to recorded data of 1 bit so that the data of 1 bit is oversampled to 2×2. A result where the process described above is performed for the oversampled signal to re-sample the same to 1×1 is illustrated in FIG. 12B. Here, peripheral unnecessary noise parts are removed so as to leave only those portions corresponding to those illustrated in FIG. 3A.

It is to be noted that, although the pixel number of the DMD is 1,240 wide (W)×726 high (H), only 256 (W)×256 (H) pixels are actually used including reference light. Further, if it is assumed that one recorded page corresponds to 192×192=36,864 bits without taking reference light and so forth into consideration, then the user data number k is the effective symbol number 1,632×8 bits=13,056 bits. Accordingly, the encoding ratio is 13,056/36,864=0.354.

Now, the data detection method to which the present invention is applied is described. In the following description, this method is referred to as mask detection method.

Here, the sparse code E(16, 3, 8) is taken as an example. In the sparse code E(16, 3, 8), 256 different codewords which may possibly be recorded as seen in FIGS. 4 to 10 are involved.

First, the amplitude of a readout signal of bits of "1" is added to the codewords to obtain evaluation values (first step).

Then, the evaluation values are checked with regard to the 256 codewords, and a maximum value among the evaluation values is determined as an identification result (second step).

A more detailed working example (flow chart) is illustrated in FIG. 13.

In the method illustrated in FIG. 13, the element number i is set to i=1 first at step ST1.

The next step ST2 corresponds to a process of "adding the amplitude of a readout signal of bits of '1'" at the first step described hereinabove. This process can be represented by the following expression (5):

$$ml(i)=\text{sum}(rd(1:16) \cdot {}^* cd(1:16,i)) \quad (5)$$

For this representation, the grammar of the MATLAB (trademark) is used.

In the expression (5) above, $rd(1:16)$ is a vector composed of elements of 4×4 readout signals, and $cd(1:16,i)$ is a vector composed of elements of ## i ## of 4×4 binary codes and represents the ith codeword which may possibly be recorded. Further, $ml(i)$ is an evaluation value of the ith codeword.

On the right side of the expression (5), the elements of $rd(1:16)$ and $cd(1:16,i)$ are multiplied by an arithmetic operation symbol of ".*", and by this, those elements of the $rd(1:16)$ which correspond to "0" of $cd(1:16,i)$ are abandoned because results of the arithmetic operation thereof are 0 while only those elements of $rd(1:16)$ which correspond to "1" are left. Then, the sum of the elements is calculated by the arithmetic operation symbol "sum" and is determined as the evaluation value $ml(i)$.

After the calculation at step ST2 with regard to the element number i=1, a result of the calculation is stored, and it is confirmed at step ST3 whether or not the element number i is i=256. Since the element number i in this instance is i=1, the element number i is incremented at step ST4, and then the arithmetic operation at step ST2 is executed again.

Then, if this loop process is repeated by 256 times and the decision of "Yes" is obtained at step ST3, then the processing advances to next step ST5.

At step ST5, the element number i is returned to the initial value 1 and a maximum element value imax is set to 1, and then a maximum evaluation value max is initialized to max=ml(1).

Then at step ST6, it is confirmed whether or not the element number i is i=256. Where the element number i is i=1, the element number i is increment at step ST7, whereafter the evaluation value ml(i) determined at step ST2 is compared with the maximum evaluation value max at step ST8. If the evaluation value ml(i) is higher than the maximum evaluation value max, then i is substituted into the maximum element value imax and the evaluation value ml(i) is substituted into the maximum evaluation value max (step ST9). If the decision at step ST8 is "No", then the processing returns to step ST6.

Such a sequence of processes as described above are repeated by 256 times to determine the maximum element value imax with which the evaluation value ml(i) assumes the maximum evaluation value max. After the processes complete by 256 times, the decision at step ST6 changes to "Yes", and consequently, the processing advances now from step ST6 to step ST10.

At step ST10, $cd(1:16,\text{imax})$ is outputted as a result of the identification.

After step ST10, the processing returns to next step ST0. Then, if a next n-bit codeword is inputted, then the processes at steps ST1 to ST10 are repeated, but if no such input is received, then the processing ends immediately.

Here, a comparative example to which the present invention is not applied is described.

FIG. 14 illustrates a flow of correlation detection to which the present invention is not applied.

The comparative example illustrated in FIG. 14 is different from the embodiment of the present invention illustrated in FIG. 13 only in that the step ST2 of FIG. 13 is replaced by a different step ST2A. Thus, the basic processing procedure is same except the step ST2A. Thus, the substance of the process at step ST2A is described below.

In particular, at step ST2A, where the ith codeword is represented by cd(1:16,i), a difference "diff" of individual bits from a target value is arithmetically operated in accordance with the following expression (6):

$$\text{diff} = rd(1:16) - rv1 * cd(1:16,i) - rv0 * \overline{cd}(1:16,i) \quad (6)$$

Also this representation is given using the grammar of the MATLAB (trademark), and $\overline{cd}(1:16,i)$ represents inversion arithmetic operation of converting "1" in a codeword cd of 16 bits composed of "1s" and "0s" into "0" and converting "0" into "1". Here, rv1 (reference value 1) is a target value of "1s" while rv0 is a target value of "0s". For example, where a readout signal is AD converted into 8 bits, since it assumes a value within a range of 0 to 255, it is appropriate to set rv1 to rv1=193 so that three fourths of the distribution are determined as a target value of "1s" and set rv1 to rv1=64 so that one fourth of the distribution is determined as a target value of "0s". The elements of the difference "diff" are squared by * and then the sum is calculated by "sum" in accordance with the following expression (7):

$$ml(i) = \text{sum}(\text{diff} .* \text{diff}) \quad (7)$$

Now, the order in hologram multiplexed recording is described.

Figure 15:
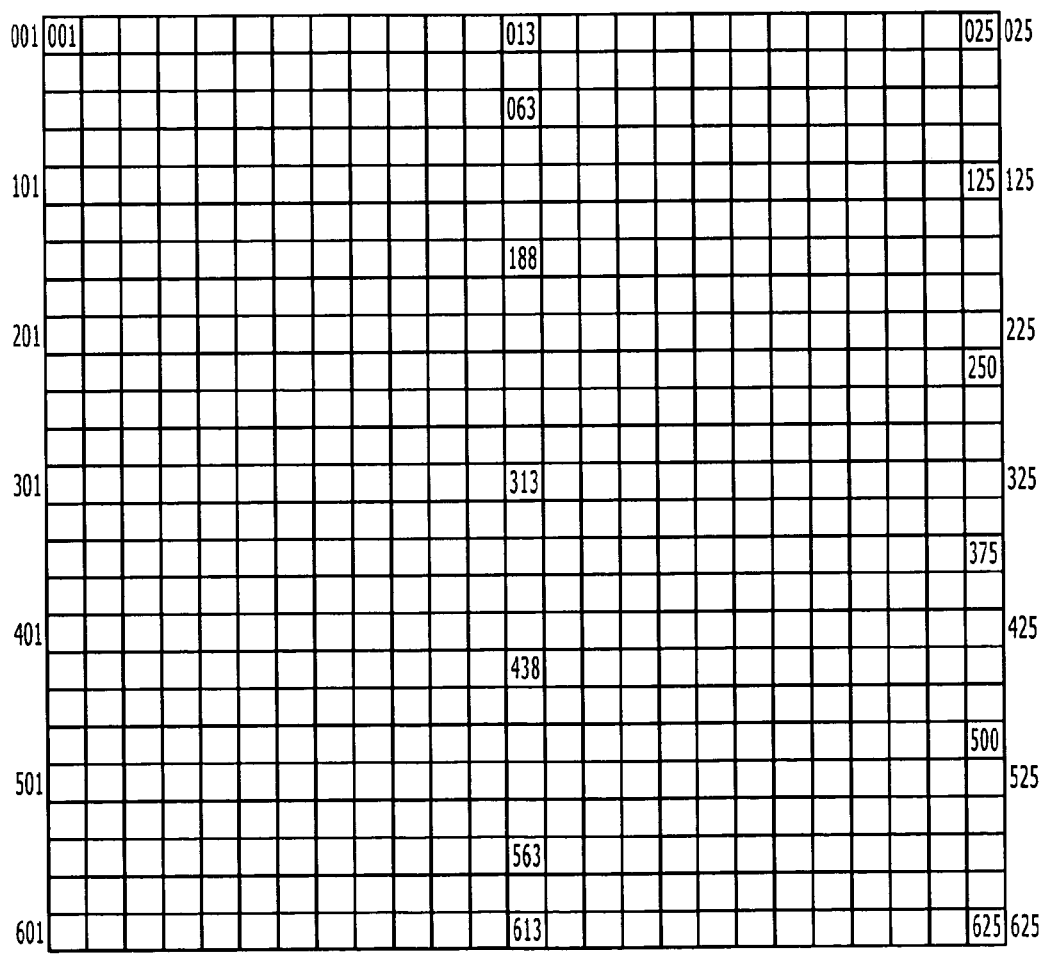
FIG. 15 is a diagrammatic view illustrating a page map and an order of hologram multiplexed recording.

FIG. 15 illustrates a page map and the order in hologram multiplexed recording.

Multiplexed recording is performed by 25 times successively displacing the page position from 001 to 025, and multiplexed recording of 25 pages is performed similarly again from the position displaced downwardly from the position of 001 upon recording. This operation is repeated to achieve multiplexed recording of totaling 625 pages.

In this manner, 625 pages are recorded by hologram recording in order from the left upper position to the right power position. All pages partly overlap with each other. The greatest number of pages overlap with each other at the 313th page at the center. A number in any square in FIG. 15 represents a page from which data are read out and evaluated. Here, a result obtained upon reading out in irradiation time of 8 ms is used.

The comparative example of FIG. 14 is compared below with the detection method of the present embodiment on the precondition of the multiplexed recording of FIG. 15.

FIGS. 16A to 16B are graphs and numerical tables indicative of comparison (error number and time) between the detection methods upon reading out in 8 ms. Here, the symbol error numbers within 1 page=1,632 symbols and the calculation time periods when various detection methods are applied are compared with each other.

The OS of the computer used is the "Windows XP Pro (trademark)", and the CPU used for the processing of the symbol detection section 33 (symbol detection step ST10) is the "Celeron (trademark) 2 GHz" while a RAM of 768 MB is used as the table 37. Further, a simulation program used was produced on the "Matlab Version 7.0 (R14) (trademark)".

Here, the graphs and the numerical values represented by "mask detection" represent results of the detection method to which the present invention is applied. This name is used because the amplitude of bits of recording data "0" is masked to ignore the bits.

Thus, it can be recognized from the results illustrated in FIGS. 16A to 16B that, if the four different detection methods are compared with each other, then the following orders are obtained.

The symbol error number (FIG. 16A): correction detection=mask detection (the two overlap with each other although this does not be seen well in FIG. 16A)<<sort detection<<threshold value detection The calculation time (FIG. 16b): correction detection>mask detection>>sort detection>>threshold detection.

In short, the identification performance of the mask detection according to the present invention is quite similar to that of the correlation detection but is much higher than the sort detection and the threshold value detection.

The calculation time according to the mask detection according to the present invention is shorter than that of the correlation calculation although the difference is very small.

Here, it is considered that the reason why the reduction effect of the calculation time is small arises from a characteristic of the program of the MATLAB (trademark). Therefore, in order to make the effect of the present invention clear, comparison in scale where a circuit is formed is attempted.

As the substance of calculation of 256 evaluation values, a circuit which implements the process of FIG. 14 needs,
(a) error calculation with target values of individual bits [16 adders],
(b) calculation of squares of the errors of the bits [16 multipliers] and
(c) calculation of the sum of the square errors [15 adders].

In contrast, a circuit which implements the process according to the present embodiment of FIG. 13 needs
(A) selection of amplitudes or "0" of bits [16 selectors], and
(B) addition of 3 bits which are not "0" [2 adders].

Further, the bit number necessary for the adders of (B) may be much smaller than that of the adders of (c). For example, where the amplitude is AD converted in 8 bits, while the adders of (a) are for 9 bits and the adders of (c) are for 22 bits, the adders of (B) may be for 10 bits.

From the foregoing, it can be recognized clearly that a bit identifier of a much simpler configuration than ever can be implemented without deteriorating the performance of correlation detection.

It is to be noted that, although the present invention is directed to an information processing apparatus to which hologram recording is applied, since the essence thereof resides in a data identification method, the present invention not only allows application to detection of hologram recorded data but also allows wide varieties of application.

What is claimed is:

1. A data identification method for identifying, from within a readout signal from a recording medium on or in which user data of k bits are recorded using a recording modulation code wherein m bits from among n bits which compose one codeword have a value of "1" while the remaining n-m bits have another value of "0", the data, n and m being integers, comprising:
   a first step of delimiting the readout signal in a unit of a codeword and adding, with regard to one of the n-bit codewords obtained by the delimiting, an amplitude of the readout signal of the bits of "1" to $2^k$ different codewords which may possibly be recorded and setting results of the addition as evaluation values; and
   a second step of finding a maximum value among the $2^k$ evaluation values and outputting the maximum value as an evaluation result.

2. The data identification method according to claim 1, wherein the first and second steps are repeated with the n-bit codeword of the identification object successively changed.

3. The data identification method according to claim 1, wherein the data are recorded by hologram recording.

4. A data identification apparatus for identifying, from within a readout signal from a recording medium on or in which user data of k bits are recorded using a recording modulation code wherein m bits from among n bits which compose one codeword have a value of "1" while the remaining n-m bits have another value of "0", the data, n and m being integers, comprising:

an evaluation value production section configured to delimit the readout signal in a unit of a codeword and add, with regard to one of the n-bit codewords obtained by the delimiting, an amplitude of the readout signal of the bits of "1" to $2^k$ different codewords which may possibly be recorded and then set results of the addition as evaluation values; and an identification result outputting section configured to find a maximum value among the $2^k$ evaluation values and output the maximum value as an evaluation result.

* * * * *